US012082450B2

(12) United States Patent
Yang et al.

(10) Patent No.: US 12,082,450 B2
(45) Date of Patent: Sep. 3, 2024

(54) DISPLAY APPARATUS AND MANUFACTURING METHOD THEREOF

(71) Applicant: Samsung Display Co., Ltd., Yongin-Si (KR)

(72) Inventors: Yonghoon Yang, Yongin-si (KR); Minsuk Ko, Yongin-si (KR); Sikwang Kim, Yongin-si (KR); Taegyun Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/727,590

(22) Filed: Apr. 22, 2022

(65) Prior Publication Data

US 2022/0246704 A1 Aug. 4, 2022

Related U.S. Application Data

(63) Continuation of application No. 16/508,265, filed on Jul. 10, 2019, now Pat. No. 11,315,993.

(30) Foreign Application Priority Data

Sep. 4, 2018 (KR) ........................ 10-2018-0105309

(51) Int. Cl.
*H10K 59/124* (2023.01)
*H10K 59/121* (2023.01)

(52) U.S. Cl.
CPC ....... *H10K 59/124* (2023.02); *H10K 59/1213* (2023.02)

(58) Field of Classification Search
None
See application file for complete search history.

(56) References Cited

U.S. PATENT DOCUMENTS

| 6,900,470 | B2 | 5/2005 | Kobayashi et al. |
| 8,362,694 | B2 | 1/2013 | Hanawa |
| 9,076,746 | B2 | 6/2015 | Chung et al. |
| 9,196,667 | B2 | 11/2015 | Im et al. |
| 9,331,128 | B2 | 5/2016 | Tokuda et al. |
| 9,722,007 | B2 | 8/2017 | Kim et al. |
| 10,020,205 | B2 | 7/2018 | You et al. |
| 10,050,099 | B2 | 8/2018 | Kim et al. |
| 10,330,993 | B2 | 6/2019 | Toyotaka |
| 10,446,614 | B2 | 10/2019 | Chae |
| 10,490,605 | B2 | 11/2019 | Lee et al. |
| 2005/0161680 | A1 | 7/2005 | Kawakami et al. |
| 2005/0179372 | A1 | 8/2005 | Kawakami et al. |
| 2006/0170712 | A1 | 8/2006 | Miller et al. |
| 2015/0090993 | A1 | 4/2015 | Tokuda et al. |

(Continued)

FOREIGN PATENT DOCUMENTS

| EP | 3240036 A1 * 11/2017 .......... H01L 27/3211 |
| JP | 2008-112112 A 5/2008 |

(Continued)

*Primary Examiner* — Telly D Green
(74) *Attorney, Agent, or Firm* — Innovation Counsel LLP

(57) ABSTRACT

A display apparatus includes a plurality of pixels. Each pixel of the pixels includes a thin film transistor, a first insulating pattern positioned on the thin film transistor, a pixel electrode positioned on the first insulating pattern, and a second insulating pattern covering an edge of the pixel electrode and contacting an edge of the first insulating pattern.

8 Claims, 13 Drawing Sheets

(56) References Cited

U.S. PATENT DOCUMENTS

| | | |
|---|---|---|
| 2016/0118451 A1 | 4/2016 | Youn et al. |
| 2016/0149155 A1 | 5/2016 | Kim |
| 2016/0190225 A1* | 6/2016 | Kim .................... H10K 59/131 |
| | | 438/23 |
| 2017/0077209 A1 | 3/2017 | Kim et al. |
| 2017/0133444 A1 | 5/2017 | Lee et al. |
| 2017/0133594 A1 | 5/2017 | Mimura et al. |
| 2017/0141169 A1 | 5/2017 | Sim et al. |
| 2017/0309688 A1 | 10/2017 | Lee et al. |
| 2017/0317154 A1 | 11/2017 | Heo |
| 2018/0233547 A1 | 8/2018 | Chung et al. |
| 2019/0131355 A1 | 5/2019 | Chae |
| 2019/0172881 A1 | 6/2019 | Yoo et al. |

FOREIGN PATENT DOCUMENTS

| | | |
|---|---|---|
| JP | 5486920 B2 | 5/2017 |
| KR | 10-2016-0054867 A | 5/2016 |
| KR | 10-2016-0081557 A | 7/2016 |
| KR | 10-2017-0031849 A | 3/2017 |
| KR | 10-2017-0124070 A | 11/2017 |

\* cited by examiner 112 114P 113P 123 311 321
                      \_\_/
                       301

DISPLAY APPARATUS AND MANUFACTURING METHOD THEREOF

This application is a continuation application of U.S. patent application Ser. No. 16/508,265, now U.S. Pat. No. 11,315,993, which claims priority to Korean Patent Application No. 10-2018-0105309 filed on Sep. 4, 2018 in the Korean Intellectual Property Office; the contents of which are hereby incorporated by reference.

BACKGROUND

1. Field

The technical field relates to a display apparatus and a method of manufacturing the display apparatus.

2. Description of the Related Art

Various designs and manufacturing methods have been implemented for improving image quality and/or reliability of display apparatuses, in order to facilitate commercialization of display apparatuses.

SUMMARY

Embodiments may be related to a display apparatus manufacturing method with a shortened manufacturing process time. Embodiments may be related to a display apparatus with minimum unwanted deformation.

According to one or more embodiments, a display apparatus includes a plurality of pixel areas in which a plurality of pixels are arranged, and includes, in each of the pixel areas, a thin film transistor; a first insulating pattern on the thin film transistor; a pixel electrode on the first insulating pattern; and a second insulating pattern covering an edge of the pixel electrode and wherein first gaps are between the first insulating patterns of the plurality of pixels and second gaps are between the second insulating patterns of the plurality of pixels.

The second insulating pattern may cover a side of the first insulating pattern.

The first insulating pattern may include a via hole that partially exposes an electrode of the thin film transistor.

The second insulating pattern may further cover a via hole in the first insulating pattern.

At least one insulating layer may be further provided between the thin film transistor and the first insulating pattern.

The plurality of pixel areas include a first pixel area in which a first pixel is arranged, and a second pixel area in which a second pixel is arranged, and the first gap between a first insulating pattern in the first pixel area and a first insulating pattern in the second pixel area may be greater than the second gap between a second insulating pattern of the first pixel area and a second insulating pattern of the second pixel area.

According to one or more embodiments, a display apparatus thin film transistors; a first insulating layer on the thin film transistors; pixel electrodes on the first insulating layer; and a second insulating layer covering edges of the pixel electrodes, wherein the first insulating layer comprises a plurality of first insulating patterns having different sizes, and the second insulating layer comprises a plurality of second insulating patterns having different sizes, and wherein first gaps are between the first insulating patterns of the first insulating layer and second gaps are between the second insulating patterns of the second insulating layer.

The first gaps between the first insulating patterns are greater than the second gaps between the second insulating patterns.

The number of the first insulating patterns of the first insulating layer is the same as the number of the second insulating patterns of the second insulating layer.

The number of the first insulating patterns of the first insulating layer is different from the number of the second insulating patterns of the second insulating layer.

Each of some of the plurality of first insulating patterns is shared by at least two pixels and each of some of the plurality of second insulating patterns is shared by at least two pixels.

According to one or more embodiments, a method of manufacturing a display apparatus includes: forming, a thin film transistor of each of a plurality of pixels; forming a first insulating layer on the thin film transistors of the plurality of pixels; forming a pixel electrode of each of the plurality of pixels on the first insulating layer; and forming a second insulating layer covering an edge of the pixel electrodes of the plurality of pixels, and wherein the first insulating layer comprises a plurality of first insulating patterns having different sizes and the second insulating layer comprises a plurality of second insulating patterns having different sizes, and wherein first gaps are between the first insulating patterns of the first insulating layer and second gaps are between the second insulating patterns of the second insulating layer.

The second insulating patterns may cover sides of the first insulating patterns.

The first insulating patterns may include at least one via hole that partially exposes an electrode of the thin film transistor.

The second insulating patterns may overlap an edge of the at least one via hole of the first insulating patterns.

The method may further include forming at least one insulating layer between the thin film transistors and the first insulating layer.

The first gaps between the first insulating patterns are greater than the second gaps between the second insulating patterns.

The number of the first insulating patterns of the first insulating layer is the same as the number of the second insulating patterns of the second insulating layer.

The number of the first insulating patterns of the first insulating layer is different from the number of the second insulating patterns of the second insulating layer.

Each of some of the plurality of first insulating patterns is shared by at least two pixels and each of some of the plurality of second insulating patterns is shared by at least two pixels.

An embodiment may be related to a display apparatus. The display apparatus may include a plurality of pixels. Each pixel of the pixels may include a thin film transistor, a first insulating pattern positioned on the thin film transistor, a pixel electrode positioned on the first insulating pattern, and a second insulating pattern covering an edge of the pixel electrode and directly contacting an edge of the first insulating pattern. The edge of the first insulating pattern may be positioned between two portions of the second insulating pattern.

The second insulating pattern may cover a side face of the first insulating pattern.

The first insulating pattern may include a hole partially exposing an electrode of the thin film transistor.

The second insulating pattern may overlap an edge of the hole.

Each of the pixels may further include an insulating layer positioned between a component of the thin film transistor and the first insulating pattern.

The pixels may include a first pixel and a second pixel. A gap between the first insulating pattern of the first pixel and the first insulating pattern of the second pixel may be greater than a gap between the second insulating pattern of the first pixel and the second insulating pattern of the second pixel.

The pixels may include a first pixel and a second pixel. The first insulating pattern of the first pixel may be directly connected to the first insulating pattern of the second pixel.

The pixels may include a first pixel and a second pixel. The second insulating pattern of the first pixel may be directly connected to the second insulating pattern of the second pixel.

The pixels may include a first pixel, a second pixel, and a third pixel. The first insulating pattern of the third pixel area may be directly connected to at least one of the first insulating pattern of the first pixel and the first insulating pattern of the second pixel.

The pixels may include a first pixel, a second pixel, and a third pixel. The second insulating pattern of the third pixel area may be directly connected to at least one of the second insulating pattern of the first pixel and the second insulating pattern of the second pixel.

An embodiment may be related to a method of manufacturing a display apparatus. The method may include forming a plurality of pixels. Formation of each pixel of the pixels may include the following steps: forming a thin film transistor; forming a first insulating pattern on the thin film transistor; forming a pixel electrode on the first insulating pattern; and forming a second insulating pattern covering an edge of the pixel electrode and directly contacting an edge of the first insulating pattern. The edge of the first insulating pattern may be positioned between two portions of the second insulating pattern.

The second insulating pattern may cover a side face of the first insulating pattern.

The first insulating pattern may include a hole partially exposing an electrode of the thin film transistor.

The second insulating pattern may overlap an edge of a hole of the first insulating pattern.

The method may further include forming an insulating layer between a component of the thin film transistor and the first insulating pattern in each pixel of the pixels.

The pixels may include a first pixel and a second pixel. A gap between the first insulating pattern of the first pixel and the first insulating pattern of the second pixel may be greater than a gap between the second insulating pattern of the first pixel and the second insulating pattern of the second pixel.

The pixels may include a first pixel and a second pixel. The first insulating pattern of the first pixel and the first insulating pattern of the second pixel may be formed of one or more same materials and may be directly connected to each other.

The pixels may include a first pixel and a second pixel. The second insulating pattern of the first pixel area and the second insulating pattern of the second pixel area may be formed of one or more same materials and may be directly connected to each other.

The pixels may include a first pixel, a second pixel, and a third pixel. The first insulating pattern of the second pixel may be directly connected to at least two of the first insulating pattern of the first pixel and the first insulating pattern of the third pixel.

The pixels may include a first pixel, a second pixel, and a third pixel. The second insulating pattern of the second pixel may be directly connected to at least two of the second insulating pattern of the first pixel and the second insulating pattern of the third pixel.

DETAILED DESCRIPTION

Figure 1:
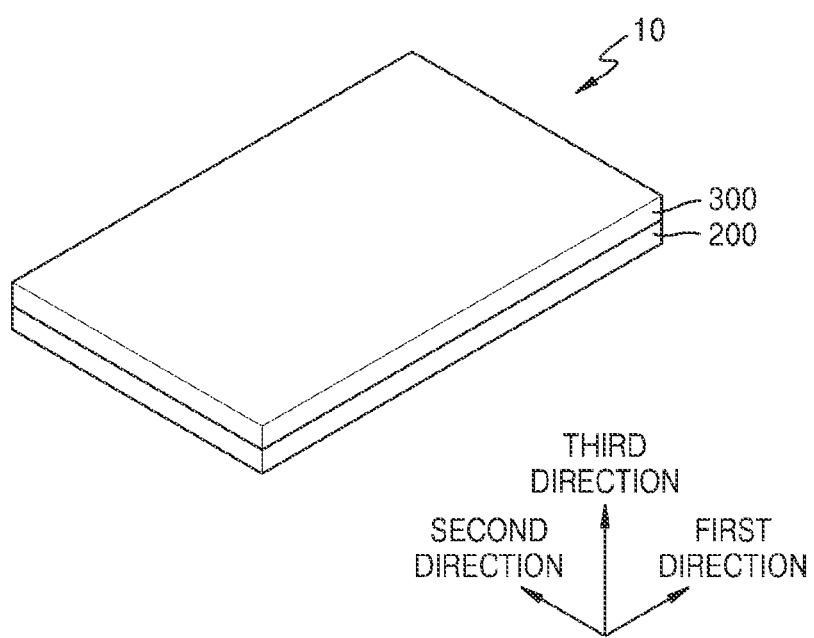
FIG. 1 is a diagram (e.g., a perspective view) schematically illustrating a display apparatus according to an embodiment.

Example embodiments are described with reference to the accompanying drawings, wherein like reference numerals may refer to like elements. Practical embodiments may have different forms and should not be construed as being limited to the descriptions set forth herein.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

In the description, an expression used in the singular may encompass the expression of the plural, unless it has a clearly different meaning in the context.

Terms such as "including," "having," and "comprising" may indicate the existence of the features or components disclosed in the specification and are not intended to preclude the possibility that one or more other features or components may be added.

When a first component is referred to as being "on" a second component, the first component may be directly on the second component, or one or more components may be present between the first component and the second component.

Sizes of components in the drawings may be exaggerated for convenience of explanation and may not limit described embodiments. When a certain embodiment may be implemented differently, a specific process order may be performed differently from the described order. For example, two consecutively described processes may be performed substantially at the same time or performed in an order opposite to the described order.

The term "correspond(s)" may be used to define a component arranged in the same area as another component.

In descriptions with reference to the drawings, same reference numerals may be given to same or corresponding elements, and descriptions may not be repeated. The term "pattern" may mean "member"; the term "pixel area" may mean "pixel"; the term "pixel" may mean "pixel area."

Figure 2:
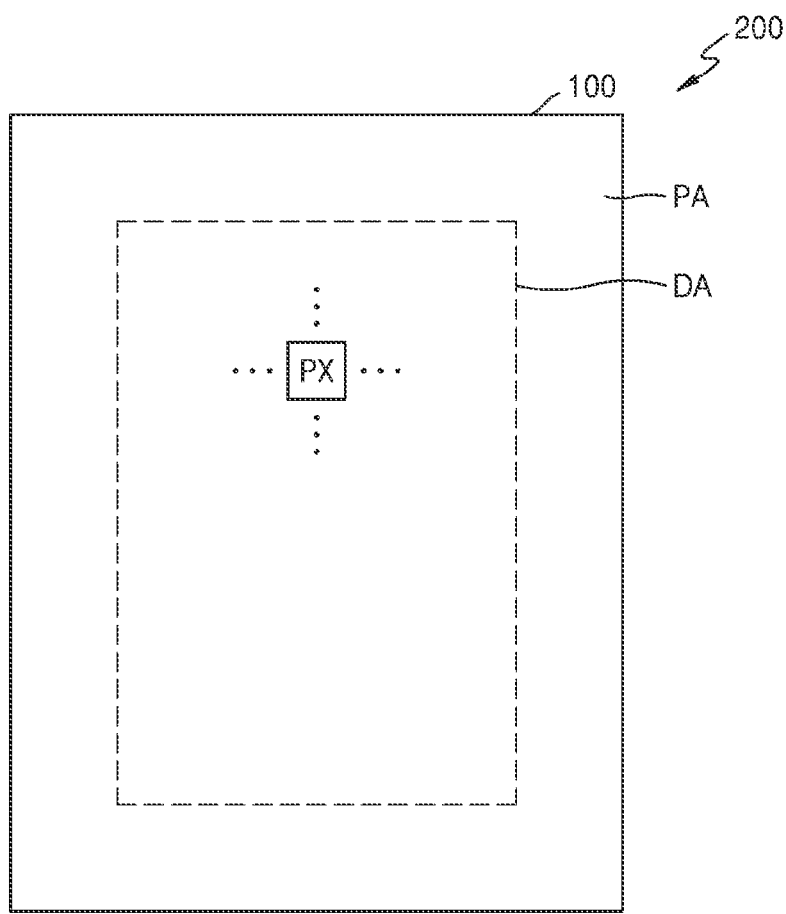
FIG. 2 is a diagram (e.g., a plan view) illustrating a display unit (disposed on a substrate) according to an embodiment.
Figure 3:
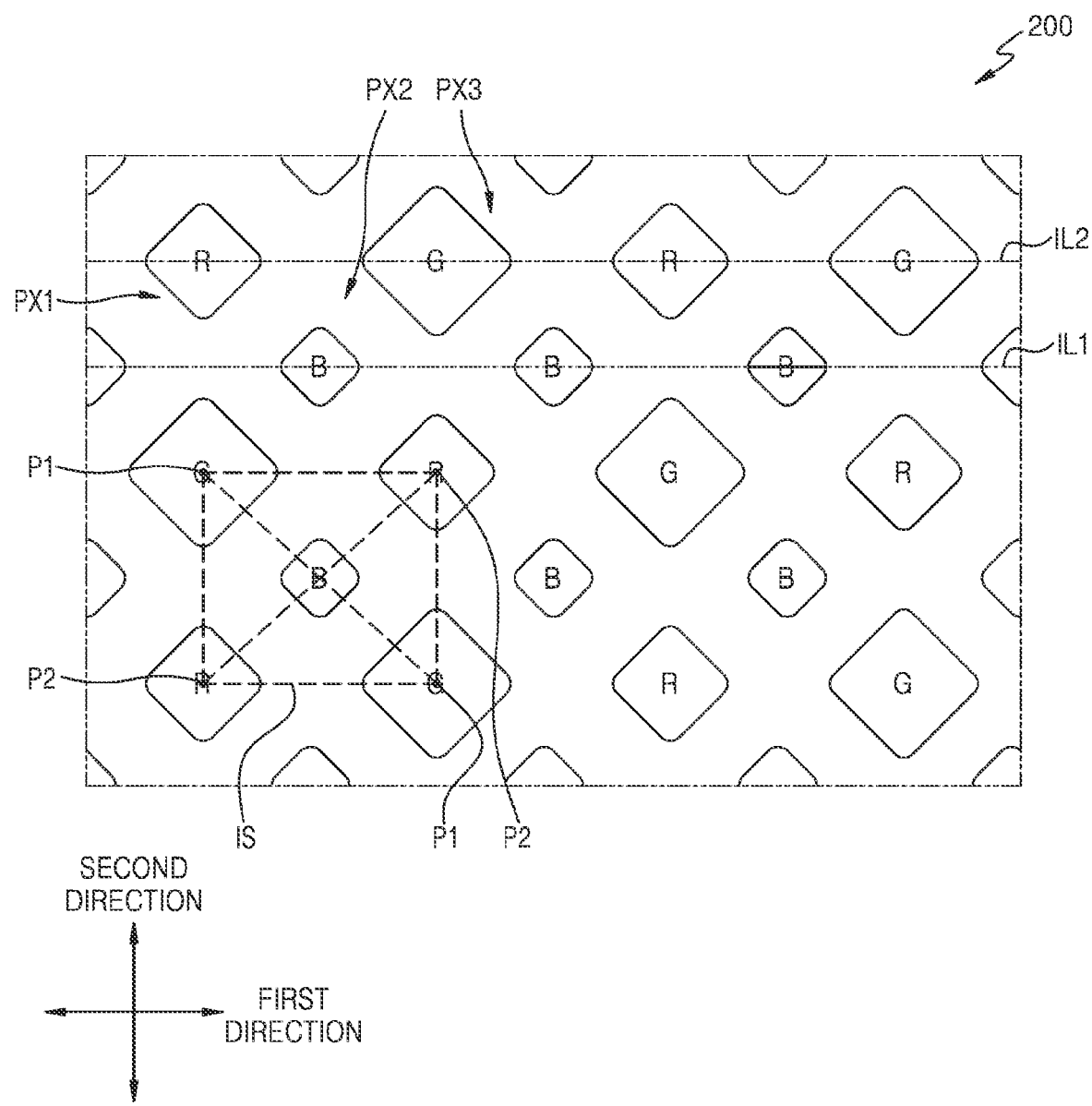
FIG. 3 is a plan view illustrating a pixel arrangement in a portion of the display unit according to an embodiment.

FIG. 1 is a diagram schematically showing a display apparatus according to an embodiment. FIG. 2 is a diagram illustrating a display panel according to an embodiment. FIG. 3 is a top-plan view illustrating a pixel arrangement in the display unit shown in FIG. 2 according to an embodiment.

Referring to FIGS. 1 through 3, a display apparatus 10 includes a display panel 200, and an encapsulation member 300, which are sequentially stacked in a third direction.

The display apparatus 10 may be a liquid crystal display, an organic light-emitting display, an electrophoretic display, an electrowetting display panel, or the like. An organic light-emitting display apparatus is described as an example.

The display panel 200 includes a substrate 100 including a display area DA and a peripheral area PA outside the display area DA.

The display panel 200 may comprise a plurality of pixels PX arranged on the display area DA of the substrate 100. Various wirings to deliver electric signals to the display area DA may be located in the peripheral area PA of the substrate 100.

The plurality of pixels PX may be arranged in a first direction (a row direction) and a second direction (a column direction) in the display panel 200. For example, a plurality of first pixels PX1, a plurality of second pixels PX2, and a plurality of third pixels PX3 may be repeatedly arranged on the substrate 100 in the first direction and the second direction, according to a certain pattern.

A pixel PX may include a display device and a pixel circuit electrically connected to the display device. The pixel circuit may include at least one thin film transistor and at least one capacitor. The display device may be an organic light-emitting device.

A first pixel PX1 may be arranged in a first pixel area of the substrate 100, a second pixel PX2 may be arranged in a second pixel area of the substrate 100, and a third pixel PX3 may be arranged in a third pixel area of the substrate 100.

An area of the second pixel PX2 may be smaller than those of the first pixel PX1 and the third pixel PX3 which are adjacent to the second pixel PX2. The second pixel PX2 may be a blue pixel B emitting blue light. Second pixels PX2 are arranged apart from one another on a first imaginary straight line IL1. The second pixel PX2 may be substantially a polygon such as a quadrangle or an octagon, a circle, an oval, or the like in a plan view of the display apparatus, and the substantial polygon may have round vertices.

A pair of third pixels PX3 are located at a pair of first vertices P1 facing each other diagonally in an imaginary quadrangle IS that has the second pixel PX2 as a center point/portion, and a pair of first pixels PX1 are located at a pair of second vertices P2 facing each other diagonally in the imaginary quadrangle IS. The imaginary quadrangle IS may be a square.

A first pixel PX1 is apart from a corresponding second pixel PX2 and a corresponding third pixel PX3 and is located at a second vertex P2 adjacent to a first vertex P1 of a corresponding imaginary quadrangle IS. The area of the first pixel PX1 may be greater than the area of the second pixel PX2 adjacent to the first pixel PX1. The first pixel PX1 may be a red pixel R emitting red light. The first pixel PX1 may be substantially a polygon such as a quadrangle or an octagon, a circle, an oval, or the like in a plan view of the display apparatus, and the substantial polygon may have round vertices.

A third pixel PX3 is apart from a corresponding first pixel PX1 and a corresponding second pixel PX2 and located at a first vertex P1 of the imaginary quadrangle IS. The area of the third pixel PX3 may be greater than the area of the second pixel PX2 adjacent to the third pixel PX3. In addition, the area of the third pixel PX3 may be different from the area of the first pixel PX1; for example, the area of the third pixel PX3 may be greater than the area of the first pixel PX1. In an embodiment, the area of the third pixel PX3 may be equal to the area of the first pixel PX1. The third pixel PX3 may be a green pixel G emitting green light. The third pixel PX3 may be substantially a polygon such as a quadrangle or an octagon, a circle, an oval, or the like in a plan view of the display apparatus, and the substantial polygon may have round vertices.

First pixels PX1 and third pixels PX3 are alternately arranged on a second imaginary straight line IL2. Two third pixels PX3 at two first vertices P1 and two first pixels PX1 at two second vertices P2 surround a corresponding second pixel PX2.

A plurality of pixels may be repeatedly arranged in the first direction on each row in order of the first pixel PX1, the second pixel PX2, the third pixel PX3, and the second pixel PX2.

In an organic light-emitting device, the efficiency of a blue pixel B is relatively low. Accordingly, in embodiments, the efficiency of the display apparatus may be improved by arranging two blue pixels B with respect to one red pixel R and one green pixel G.

The pixels PX shown in FIG. 3 may have emission units. Emission unit may be the display device (the organic light-emitting device) of the pixel or an emission layer of the display device. An aperture ratio of a pixel may depend on an area of the emission unit.

The encapsulation member 300 may include at least one thin film stacked on the display panel 200. In an embodiment, the encapsulation member 300 may include a plurality of thin films to prevent moisture and/or air from permeating into the display panel 200.

The encapsulation member 300 may cover the display panel 200. The encapsulation member 300 may include at least one inorganic layer including inorganic material and at least one organic layer including organic material. In some embodiments, the encapsulation member 300 may have a structure in which a first inorganic layer, an organic layer, and a second organic layer are sequentially stacked.

Although it is not shown, various functional layers, for example, a polarization layer to reduce reflection of external light, a black matrix, a color filter, and/or a touch-screen layer including a touch electrode, and the like may be provided at an upper area of the encapsulation member 300.

In addition, a window may be combined to the upper area of the encapsulation member 300 by using a pressure sensitive adhesive (PSA).

Figure 4:
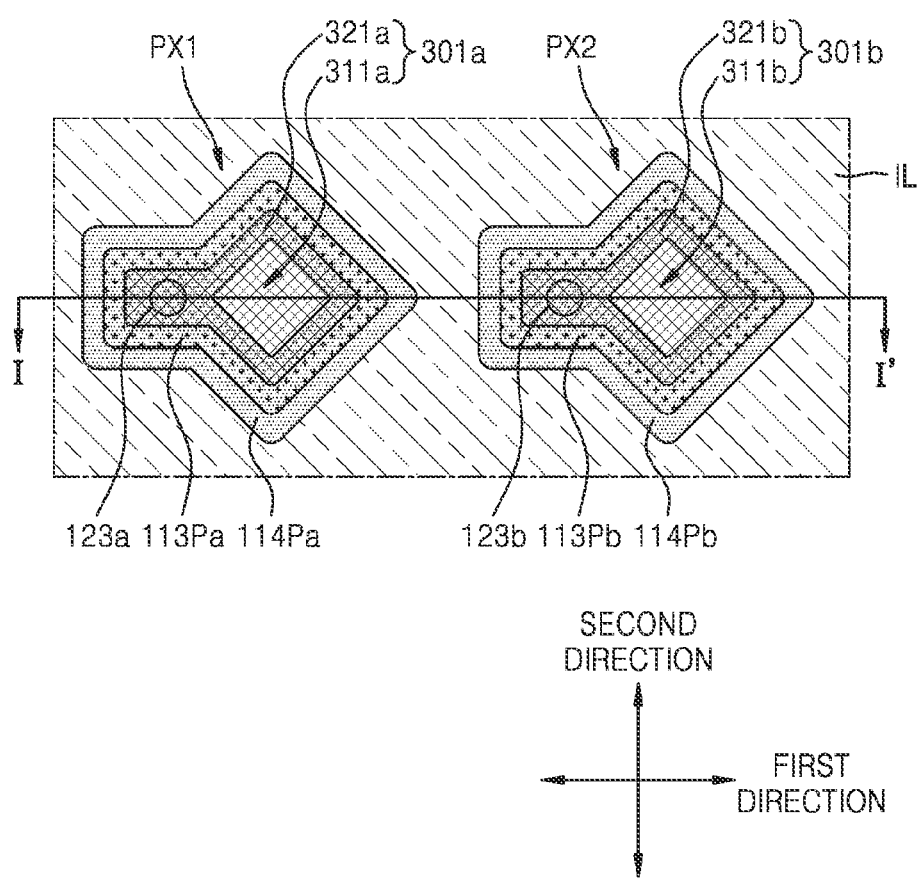
FIG. 4 is a plan view illustrating a part of a display unit according to an embodiment.
Figure 5A:
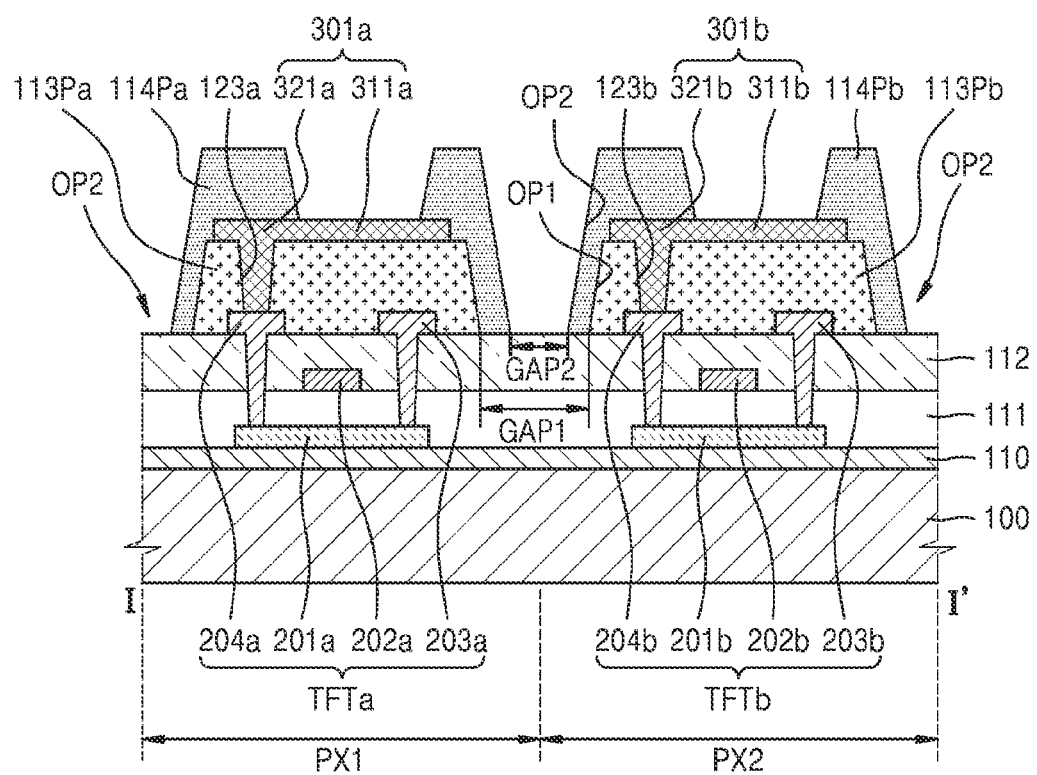
FIG. 5A illustrates a cross-sectional view taken along a plane I-I' indicated in FIG. 4 according to an embodiment.
Figure 5B:
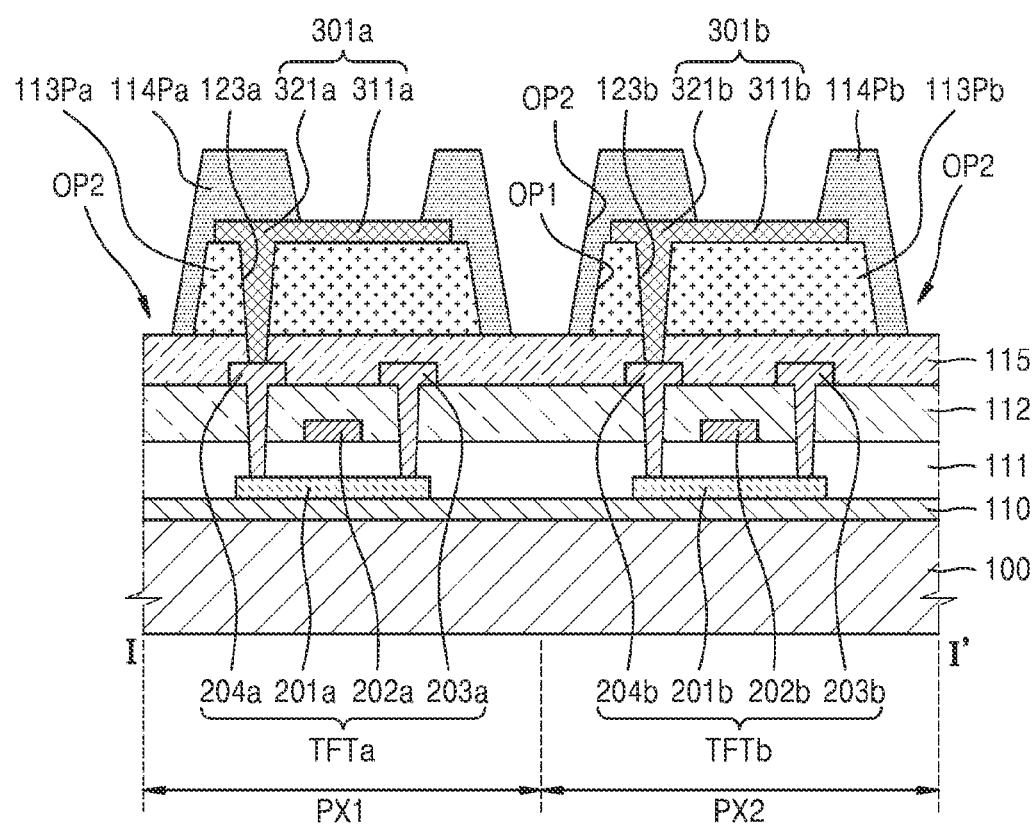
FIG. 5B illustrates a cross-sectional view taken along a plane I-I' indicated in FIG. 4 according to an embodiment.

FIG. 4 is a partial plan view illustrating a part of the display panel 200 shown in FIG. 3 according to an embodiment. FIG. 5A illustrates a cross-sectional view taken along a plane I-I' shown in FIG. 4 according to an embodiment. FIG. 5B illustrates a cross-sectional view taken along a plane I-I' shown in FIG. 4 according to an embodiment.

In each of the pixels (or pixel areas) in the display panel 200 according to embodiments, an organic insulating layer under the pixel electrode and an organic insulating layer on the pixel electrode may be provided in the form of islands in pixel units.

In FIGS. 4, 5A, and 5B, for convenience of explanation, a first pixel PX1 and a second pixel PX2 are described as examples, and at least some of the descriptions may be analogously applied to a third pixel PX3.

Referring to FIGS. 4, 5A, and 5B, the first pixel PX1 may include at least one first thin film transistor TFTa and a first organic light-emitting device OLEDa as a display device. The first organic light-emitting device OLEDa may include a first pixel electrode 301a, an opposite electrode (analogous to 305a shown in FIG. 6) opposite the first pixel electrode 301a, and an emission layer (analogous to 303a shown in FIG. 6) between the first pixel electrode 301a and the opposite electrode. The second pixel PX2 may include at least one second thin film transistor TFTb and a second organic light-emitting device OLEDb as a display device. The second organic light-emitting device OLEDb may include a second pixel electrode 301b, an opposite electrode opposite the second pixel electrode 301b, and an emission layer between the second pixel electrode 301b and the opposite electrode. In FIGS. 4, 5A, and 5B, for convenience of explanation, the first pixel electrode 301a of the first organic light-emitting device OLEDa, the first thin film transistor TFTa, the second pixel electrode 301b of the second organic light-emitting device OLEDb, and the second thin film transistor TFTb are illustrated.

The first organic light-emitting device OLEDa and the second organic light-emitting device OLEDb may be arranged on at least one insulating layer IL that covers the first thin film transistor TFTa and the second thin film transistor TFTb, and may respectively correspond to the first thin film transistor TFTa and the second thin film transistor TFTb. The insulating layer IL may cover and planarize the pixel circuit. In an embodiment, an uppermost layer of the insulating layer IL may be a second insulating layer 112 shown in FIG. 5A. In an embodiment, an uppermost layer of the insulating layer IL may be a fifth insulating layer 115 shown in FIG. 5B. The fifth insulating layer 115 may be arranged between the second insulating layer 112 and first insulating patterns 113Pa and 113Pb.

The first thin film transistor TFTa may include a first active layer 201a arranged on the buffer layer 110, a first gate electrode 202a that is insulated from the first active layer 201a and overlaps a part of the first active layer 201a, a first source electrode 203a, and a first drain electrode 204a. One of the first source electrode 203a and the first drain electrode 204a, e.g., the first drain electrode 204a, may be electrically connected to the first pixel electrode 301a. The first source electrode 203a and the first drain electrode 204a may respectively be electrically connected to a source area and a drain area in the first active layer 201a.

The second thin film transistor TFTb may include a second active layer 201b arranged on the buffer layer 110, a second gate electrode 202b insulated from the second active layer 201b and overlaps a part of the second active layer 201b, a second source electrode 203b, and a second drain electrode 204b. One of the second source electrode 203b and the second drain electrode 204b, e.g., the second drain electrode 204b, may be electrically connected to the second pixel electrode 301b. The second source electrode 203b and the second drain electrode 204b may be respectively electrically connected to a source area and a drain area in the second active layer 201b.

A first insulating layer 111 may be arranged as a gate insulating layer between the first active layer 201a and the first gate electrode 202a, and between the second active layer 201b and the second gate electrode 202b. A second insulating layer 112 may be arranged as an interlayer insulating layer between the first gate electrode 202a and each of the first source electrode 203a and the first drain electrode 204a, and between the second gate electrode 202b and each of the second source electrode 203b and the second drain electrode 204b.

A thin film transistor TFT according to an embodiment is a top gate type in which a gate electrode is arranged above an active region with the substrate 100 being at the bottom. In an embodiment, a thin film transistor TFT may be a bottom gate type in which a gate electrode is arranged below an active layer with the substrate 100 being at the bottom.

The buffer layer 110, the first insulating layer 111, and the second insulating layer 112 may extend not only to the display area DA but also to a part of a non-display area NDA around the display area DA. According to an embodiment, the buffer layer 110, the first insulating layer 111, and the second insulating layer 112 may be arranged on an area except an outermost edge area of the substrate 100.

The first insulating patterns 113Pa and 113Pb may be arranged on the first thin film transistor TFTa and the second thin film transistor TFTb. The first insulating pattern 113Pa may cover and/or overlap the first thin film transistor TFTa, and the first insulating pattern 113Pb may cover and/or overlap the second thin film transistor TFTb.

Referring to FIG. 5B, when the fifth insulating layer 115 is arranged on the second insulating layer 112, the fifth insulating layer 115 may cover the first thin film transistor TFTa and the second thin film transistor TFTb, the first insulating pattern 113Pa may cover and/or overlap at least a part of the first thin film transistor TFTa, and the first insulating pattern 113Pb may cover and/or overlap at least a part of the second thin film transistor TFTb.

The first insulating patterns 113Pa and 113Pb may be arranged in the form of islands. As seen from top, the first insulating patterns 113Pa and 113Pb may respectively have shapes similar to shapes of the corresponding first pixel electrode 301a and the corresponding second pixel electrode 301b. A via hole 123a partially exposing one of the first source electrode 203a and the first drain electrode 204a in the first thin film transistor TFTa may be provided in the first insulating pattern 113Pa. A via hole 123b partially exposing one of the second source electrode 203b and the second drain electrode 204b in the second thin film transistor TFTb may be provided in the first insulating pattern 113Pb.

Each of the first insulating patterns 113Pa and 113Pb may be a single layer or a multi-layer structure including an organic material. In an embodiment, each of the first insulating patterns 113Pa and 113Pb may be a laminate including at least one inorganic insulating layer and at least one organic insulating layer.

The first pixel electrode 301a of the first pixel PX1 may be arranged in the form of an island on the first insulating pattern 113Pa, and the second pixel electrode 301b of the second pixel PX2 may be arranged in the form of an island on the first insulating pattern 113Pb. The first pixel electrode 301a may be electrically connected to the first thin film transistor TFTa through the via hole 123a. The second pixel electrode 301b may be electrically connected to the second thin film transistor TFTb through the via hole 123b.

In FIGS. 4, 5A, and 5B, a pixel electrode is electrically connected to a drain electrode. In an embodiment, a pixel electrode may be electrically connected to a source electrode.

An edge of the first pixel electrode 301a may be covered by the second insulating pattern 114Pa, and an edge of the second pixel electrode 301b may be covered by the second insulating pattern 114Pb. The second insulating patterns 114Pa and 114Pb may be arranged in the form of islands. As seen from top, the second insulating patterns 114Pa and 114Pb may have shapes similar to shapes of the corresponding first pixel electrode 301a and the corresponding second pixel electrode 301b. The second insulating pattern 114Pa may cover a side surface of the first insulating pattern 113Pa and a top surface portion of the first insulating pattern 113Pa that are not covered by the first pixel electrode 301a. The second insulating pattern 114Pb may cover a side surface of the first insulating pattern 113Pb and a top surface portion of the first insulating pattern 113Pb that are not covered by the second pixel electrode 301b. The second insulating pattern 114Pa may cover and/or overlap an area of the first pixel electrode 301a corresponding to the via hole 123a. The second insulating pattern 114b may cover and/or overlap an area of the second pixel electrode 301b corresponding to the via hole 123b.

Each of the second insulating patterns 114Pa and 114Pb may be a single layer or a multi-layer structure including an organic material. In an embodiment, each of the second insulating patterns 114Pa and 114Pb may be a laminate including at least one inorganic insulating layer and at least one organic insulating layer.

As the first insulating pattern 113Pa of the first pixel PX1 and the first insulating pattern 113Pb of the second pixel PX2 are respectively arranged in the form of independent islands, a first opening OP1 may be formed between the first insulating patterns 113Pa and 113Pb.

As the second insulating pattern 114Pa of the first pixel PX1 and the second insulating pattern 114Pb of the second pixel PX2 are arranged in the form of independent islands, a second opening OP2 may be formed between the second insulating patterns 114Pa and 114Pb.

Due to the first opening OP1 and the second opening OP2, gaps may be formed between structures of the first pixel PX1 and structures of the second pixel PX2. A first gap GAP1 formed due to the first opening OP1 may be greater than a second gap GAP2 formed due to the second opening OP2.

The first pixel electrode 301a may include a first area 311a on which an emission layer is arranged and a second area 321a around the first area 311a. The first area 311a in the first pixel electrode 301a may have a shape of a substantial polygon such as a rectangle or an octagon, a circle, an oval, or the like. The emission layer (not shown) may be arranged on the first area 311a of the first pixel electrode 301a, and an opposite electrode (not shown) may be formed on the emission layer. The form of the first pixel PX1 may be determined according to the form of the first area 311a of the first pixel electrode 301a. The second area 321a of the first pixel electrode 301a is an area covered by the second insulating pattern 114Pa, and a part of the second area 321a may be located above/on the via hole 123a. The direction in which the second area 321a extends from the first area 311a may be configured according to embodiments.

Similarly, the second pixel electrode 301b may include a first area 311b on which an emission layer is arranged, and a second area 321b around the first area 311b. The first area 311b of the second pixel electrode 301b may have a shape such as a substantial polygon like a rectangle or an octagon, a circle, and an oval. An emission layer (not shown) is arranged on the first area 311b of the second pixel electrode 301b, and an opposite electrode (not shown) may be formed on the emission layer. The form of the second pixel PX2 may be determined according to the form of the first area 311b of the second pixel electrode 301b. The second area 321b of the second pixel electrode 301b is an area covered by the second insulating pattern 114Pb, and a part of the second area 321b may be located above/on the via hole 123b.

The direction in which the protrusions in the second areas 321a and 321b extend from the first areas 311a and 311b may be configured according to embodiments. Referring to FIG. 4, as seen from top, the protrusions in the second areas 321a and 321b respectively extend in the first direction from a side of the first area 311a and a side of the first area 312a. In an embodiment, the second areas 321a and 321b may respectively extend in the second direction or a diagonal direction from a side of the first area 311a and a side of the first area 311b. Structures of the second areas 321a and 321b may be configured according to a pixel arrangement, a via hole arrangement, and the like. The areas of the second areas 321a and 321b may be different in different pixels according to a pixel arrangement, a via hole arrangement, and the like.

Figure 6:
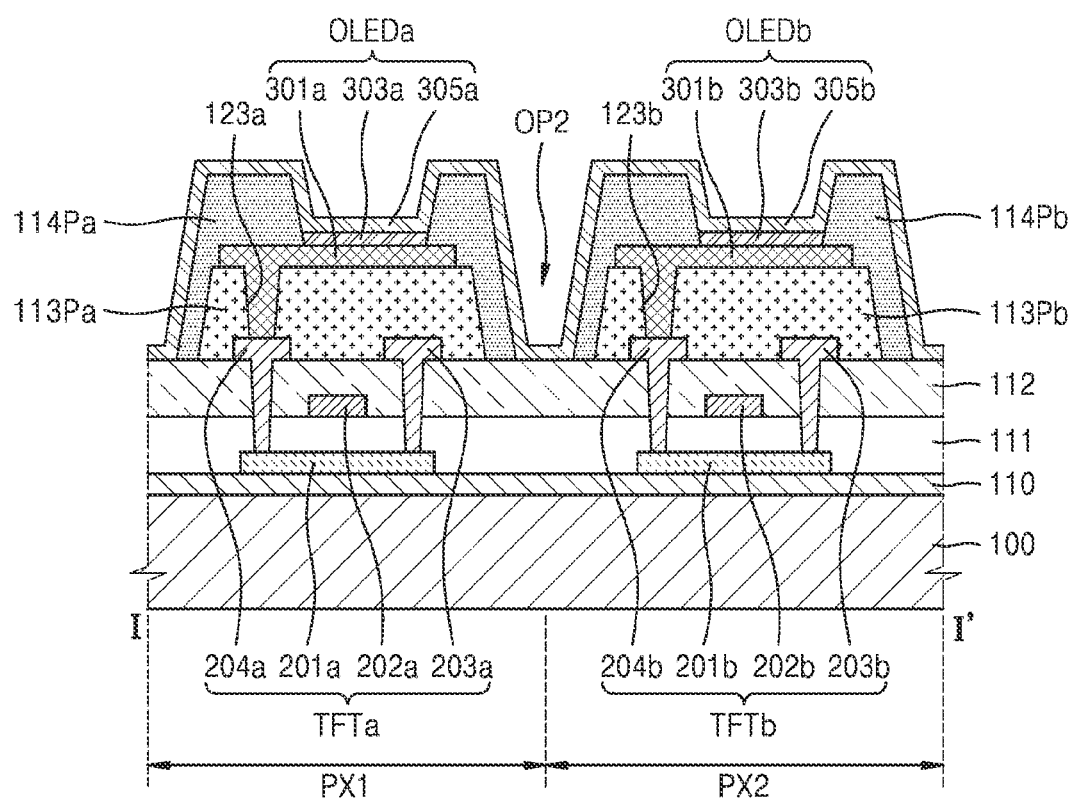
FIG. 6 is a cross-sectional view illustrating an organic light-emitting device of a display apparatus according to an embodiment.

FIG. 6 is a cross-sectional view illustrating an organic light-emitting device according to an embodiment.

Referring to FIG. 6, intermediate layers 303a and 303b, each including an emission layer, may be respectively arranged at an exposed upper surface portion of the first pixel electrode 301a and an exposed upper surface portion of the second pixel electrode 301b respectively exposed by the second insulating patterns 114Pa and 114Pb. Each of the intermediate layers 303a and 303b may include at least one functional layer. Some functional layers of the intermediate layers 303a and 303b may cover an upper surface of the first pixel electrode 301a, an upper surface of the second pixel electrode 301b, and upper surfaces and/or side surfaces of the second insulating patterns 114Pa and 114Pb. Some functional layers of the intermediate layers 303a and 303b may cover an upper surface of the first pixel electrode 301a, an upper surface of the second pixel electrode 301b, upper surfaces and/or side surfaces of the second insulating patterns 114Pa and 114Pb, and an upper surface portion of the second insulating layer 112 exposed via the second opening OP2. Opposite electrodes 305a and 305b may be respectively arranged at upper portions of the intermediate layers 303a and 303b. The opposite electrode 305a of the first pixel PX1 and the opposite electrode 305b of the second pixel PX2 may be integral with (i.e., directly connected to) each other. The opposite electrodes 305a and 305b may be integrally formed on the entire surface of the substrate 100 and may cover upper surfaces and side surfaces of the second insulating patterns 114Pa and 114Pb and the upper surface portion of the second insulating layer 112 exposed via the second opening OP2.

FIGS. 7 through 11 are cross-sectional views schematically illustrating structures formed in a process of forming a pixel shown in FIG. 3 in an embodiment. The pixel PX may be one of the first pixel PX1, the second pixel PX2, and the third pixel PX3.

Figure 7:
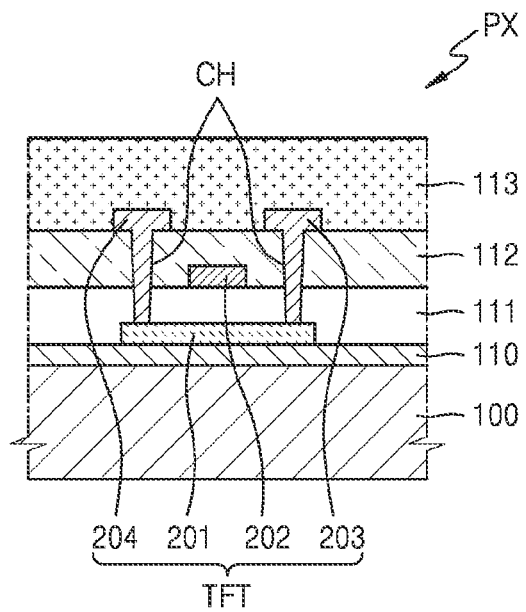
FIG. 7, FIG. 8, FIG. 9, FIG. 10, and FIG. 11 are cross-sectional views schematically illustrating structures formed in a process of forming a pixel of a display apparatus according to an embodiment.

Referring to FIG. 7, the buffer layer 110 is formed on the substrate 100, and a thin film transistor TFT of the pixel PX may be formed on the buffer layer 110.

The substrate 100 may include a glass material, a ceramic material, a metal material, a plastic material, or a flexible or bendable material. The substrate 100 may include a material that has high thermal resistance and durability and may have a curved surface; the material may include one or more of polyethylene ether phthalate, polyethylene naphthalate, polycarbonate, polyarylate, polyetherimide, polyethersulfone, polyimide, and the like. In an embodiment, the substrate 100 may include one or more flexible materials.

The substrate 100 may have a single-layer structure or a multi-layer structure including one or more of the above-mentioned materials, and the multi-structure may further include an inorganic material. In some embodiments, the substrate 100 may have a structure including an organic material layer, an inorganic material layer, and another organic material.

The buffer layer 110 may include at least one of an inorganic layer and an organic layer. For example, the buffer layer 110 may prevent an impure element from permeating through the substrate 100, may planarize a surface of the substrate 100, and may include a single layer or a multi-layer structure including an inorganic material such as silicon nitride (SiNx) and/or silicon oxide (SiOx). The buffer layer 110 may be unnecessary in an embodiment.

An active layer 201 of the thin film transistor TFT may be formed on the buffer layer 110. The active layer 201 may be formed by patterning a semiconductor layer that is previously formed on the buffer layer 110. For example, the semiconductor layer may include an inorganic semiconductor material such as amorphous silicon or crystalline silicon. As another example, the semiconductor layer may include an oxide semiconductor or an organic semiconductor material.

The first insulating layer 111 may be arranged on the active layer 201. The first insulating layer 111 may be an inorganic insulating layer. The first insulating layer 111 may include a single layer or a multi-layer structure including at least one insulating layer including or made of one or more of silicon dioxide (SiO$_2$), silicon nitride (SiNx), silicon oxynitride (SiON), aluminum oxide (Al$_2$O$_3$), titanium oxide (TiO$_2$), tantalum pentoxide (Ta$_2$O$_5$), hafnium oxide (HfO$_2$), zirconium oxide (ZrO$_2$), barium strontium titanate (BST), and lead zirconate titanate (PZT).

The gate electrode 202 may be formed on the first insulating layer 111 and may overlap a channel area of the active layer 201. The gate electrode 202 may include one or more conductive materials. The gate electrode 202 may include a single layer or a multi-layer structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The second insulating layer 112 may be arranged on the gate electrode 202, and a source electrode 203 and a drain electrode 204 may be formed on the second insulating layer 112.

The second insulating layer 112 may be an inorganic insulating layer. The second insulating layer 112 may include a single layer or a multi-layer structure including at least one of SiO2, SiNx, SiON, Al$_2$O$_3$, TiO$_2$, Ta$_2$O$_5$, HfO$_2$, ZrO$_2$, BST, and PZT. In an embodiment, the second insulating layer 112 may include an organic insulating layer. Contact holes CH to expose portions of the source area and the drain area of the active layer 201 may be formed in the second insulating layer 112 and the first insulating layer 111.

The source electrode 203 and the drain electrode 204 may respectively contact a source area and a drain area of the active layer 201 via the contact holes CH. The source electrode 203 and the drain electrode 204 may include one or more conductive materials. Each of the source electrode 203 and the drain electrode 204 may include a single layer or a multi-layer structure including at least one of Al, Pt, Pd, Ag, Mg, Au, Ni, Nd, Ir, Cr, Li, Ca, Mo, Ti, W, and Cu.

A third insulating layer 113 may be arranged on the source electrode 203 and the drain electrode 204. The third insulating layer 113 may include an organic insulating layer in a single-layer or a multi-layer structure. The third insulating layer 113 may include at least one of a general purpose polymer (for example, poly(metha acrylate) (PMMA), polystyrene (PS)), a polymer derivative having a phenol group, an acrylic polymer, an imide polymer, an arylether polymer, an amide polymer, a fluorine polymer, a p-xylene polymer, a vinyl alcohol polymer, and a blend. For example, the third insulating layer 113 may include at least one of polyimide, polyamide, an acrylic resin, and the like.

Figure 8:
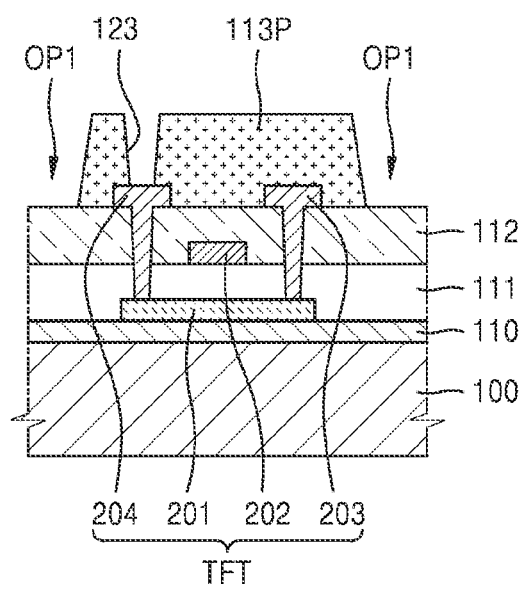

Referring to FIG. 8, by patterning the third insulating layer 113, a via hole 123 to partially expose one of the source electrode 203 and the drain electrode 204 (e.g., the drain electrode 204 in FIG. 8) and a first opening OP1 to expose the top surface of the second insulating layer 112 may be formed. The third insulating layer 113 may be formed into a plurality of first insulating patterns 113P separated by first openings OP1 for different pixels. The first insulating pattern 113P may overlap the thin film transistor TFT.

In an embodiment, before forming the third insulating layer 113, the fifth insulating layer 115 may be formed on (the entire surface of) the substrate 100, as shown in FIG. 5B. The first insulating patterns 113P may be arranged on the fifth insulating layer 115. The via hole 123 is formed in the fifth insulating layer 115 and the third insulating layer 113, and an upper surface of the fifth insulating layer 115 may be exposed by the first opening OP1. The fifth insulating layer 115 may include an inorganic insulating layer and/or an organic insulating layer in a single layer or a multi-layer structure.

Figure 9:
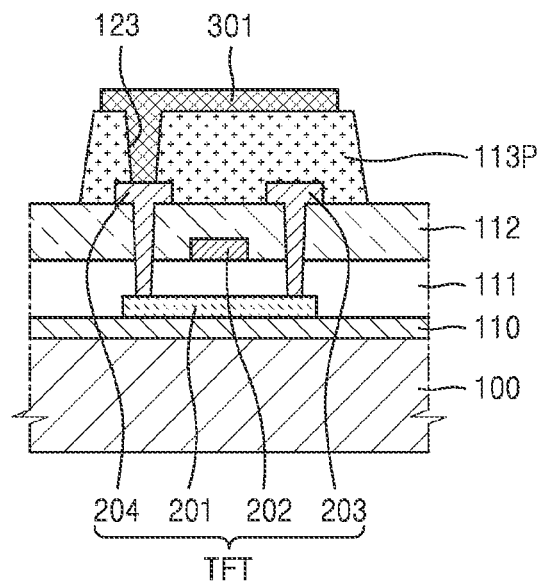

Referring to FIG. 9, a pixel electrode 301 may be formed on the first insulating pattern 113P. The pixel electrode 301 may directly contact one of the source electrode 203 and the drain electrode 204 (e.g., the drain electrode 204 in FIG. 9) through the via hole 123.

Figure 10:
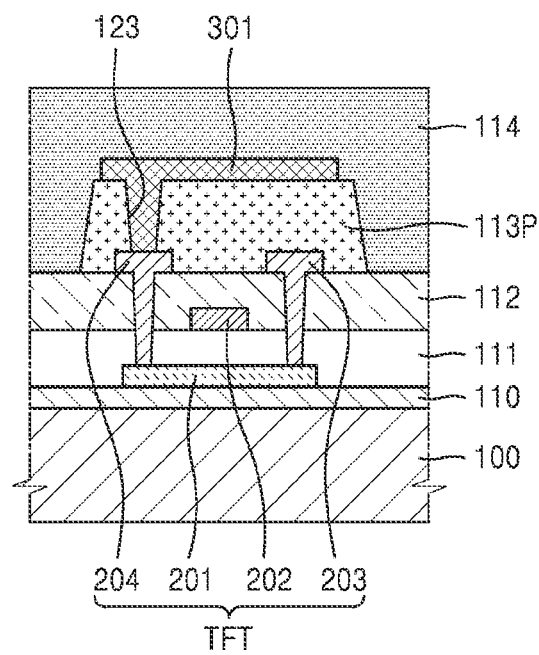

Referring to FIG. 10, a fourth insulating layer 114 may be formed on (the entire surface of) the substrate 100 and may cover the pixel electrode 301. The fourth insulating layer 114 may include an organic insulating layer in a single layer or a multi-layer structure. The fourth insulating layer 114 may include at least one of a general purpose polymer (for example, PMMA, PS), a polymer derivative having a phenol group, an acrylic polymer, an imide polymer, an arylether polymer, an amide polymer, a fluorine polymer, a p-xylene polymer, a vinyl alcohol polymer, and a blend. For example, the fourth insulating layer 114 may include at least one of polyimide, polyamide, an acrylic resin, and the like. In an embodiment, the fourth insulating layer 114 may be an inorganic layer or stacked layers including at least one inorganic insulating layer and at least one organic insulating layer.

Figure 11:
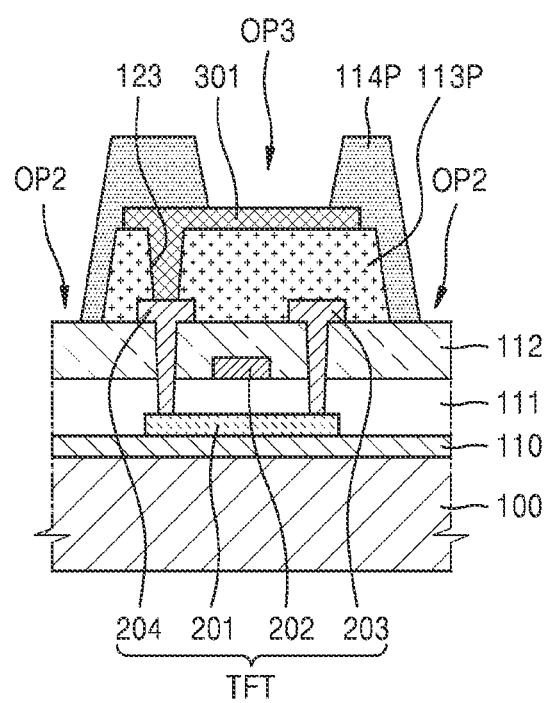

Referring to FIG. 11, by patterning the fourth insulating layer 114, a third opening OP3 to partially expose the pixel electrode 301 and second openings OP2 to expose top surface portions of the second insulating layer 112 may be formed. The fourth insulating layer 114 may be patterned to form a plurality of second insulating patterns 114P for different pixels. A second insulating pattern 114P may function as a pixel defining layer.

Next, an intermediate layer including an emission layer may be provided in the third opening OP3, and an opposite electrode at an upper surface of the intermediate layer may be provided on the entire surface of the substrate 100.

In embodiments, a first insulating pattern 113P and a second insulating pattern 114P are provided in each pixel of a display apparatus.

Figure 12:
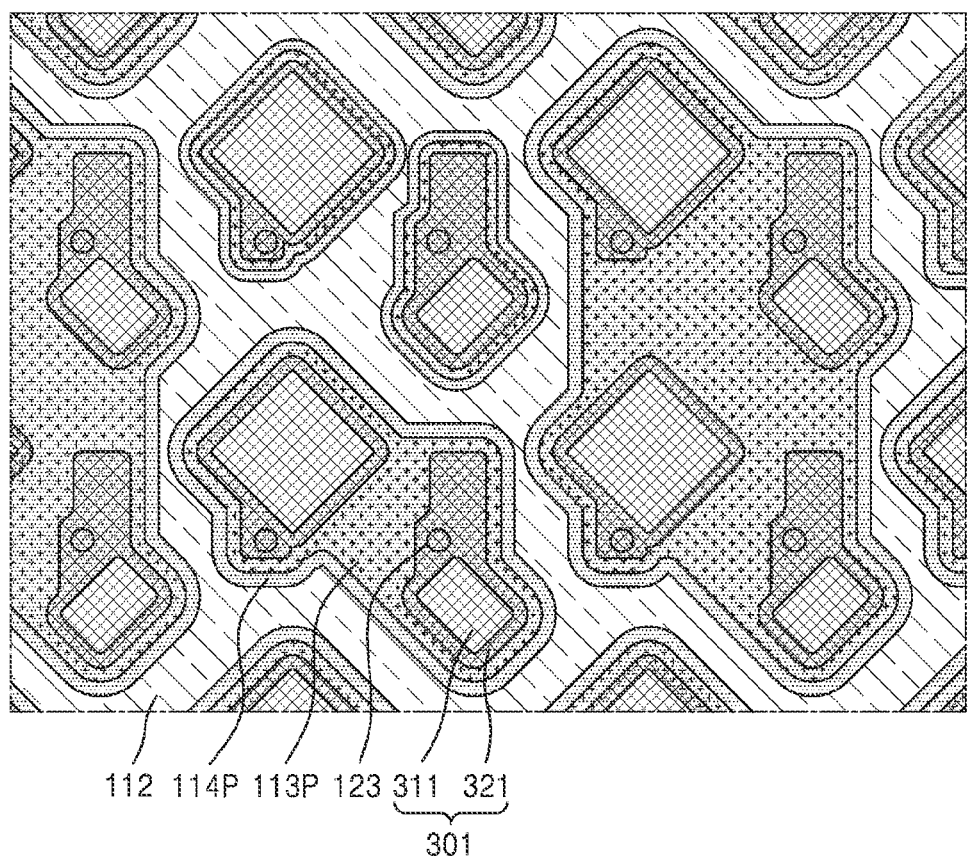
FIG. 12 illustrates a plan view of a portion of a display apparatus according to an embodiment.
Figure 13:
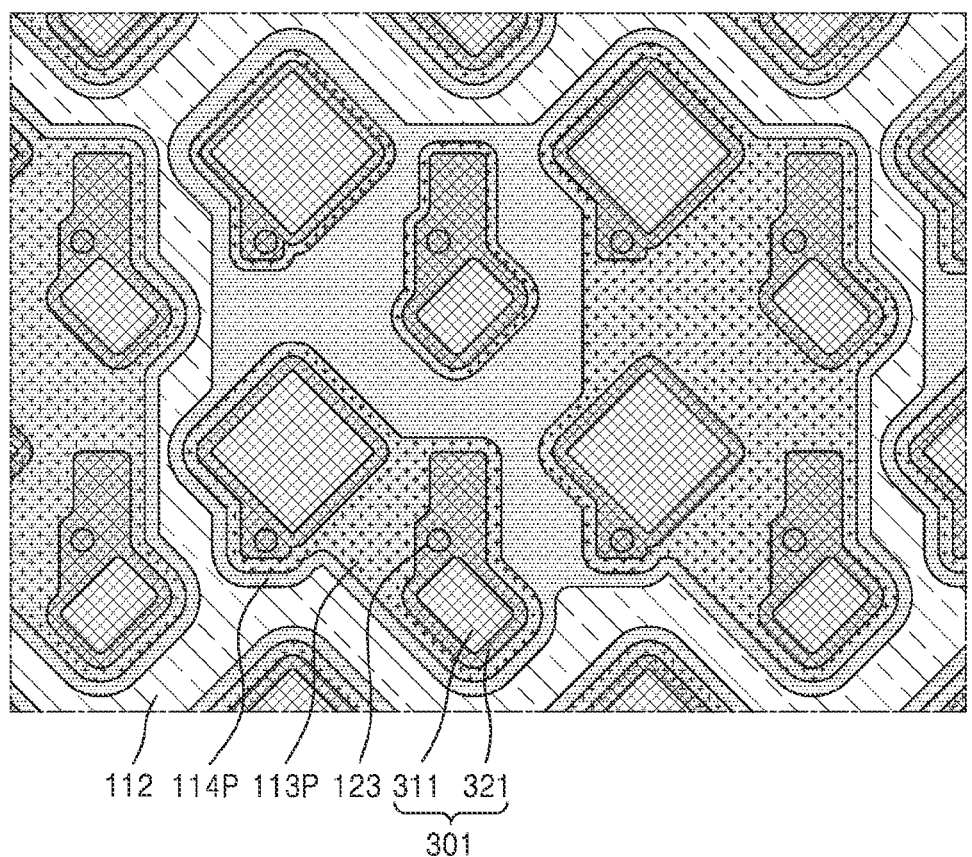
FIG. 13 illustrates a plan view of a portion of a display apparatus according to an embodiment.
Figure 14:
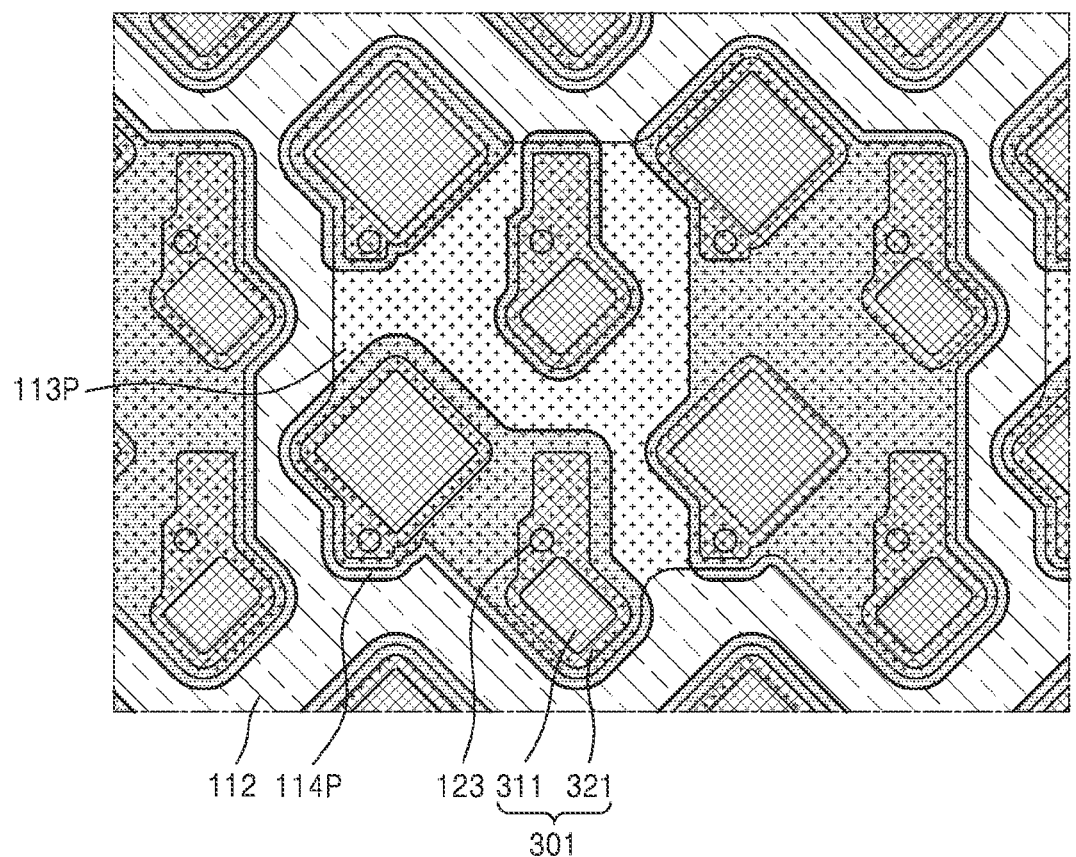
FIG. 14 illustrates a plan view of a portion of a display apparatus according to an embodiment.

FIGS. 12 through 14 are top plan views of display apparatuses according to embodiments.

Referring to FIGS. 12 through 14, a first insulating pattern 113P is formed in at least one pixel on the second insulating layer 112, one or more pixel electrodes 301 may be formed in one or more pixels on the first insulating pattern 113P, and a second insulating pattern 114P may be formed in the at least one pixel on the one or more pixel electrodes 301. For some pixels, a first insulating pattern 113P may have a unitary structure corresponding to at least two pixels, the at least two pixels may share the first insulating pattern 113P, the second insulating pattern 114P may have a unitary structure corresponding to the at least two pixels, and the at least two pixels may share the second insulating pattern 114P. That is, each of some of the plurality of first insulating patterns 113P may be shared by at least two pixels. Sizes of the plurality of first insulating patterns 113P may be different each other. And each of some of the plurality of second insulating patterns 114P may be shared by at least two pixels. Sizes of the plurality of second insulating patterns 113P may be different each other.

FIG. 12 illustrates an embodiment in which a first insulating pattern 113P and a second insulating pattern 114P correspond to the same number of pixels. That is, the number of the first insulating patterns 113P of the third insulating layer 113 is the same as the number of the second insulating patterns 114P of the fourth insulating layer 114. The first insulating pattern 113P and the second insulating pattern 114P may each correspond to and be arranged/included in one pixel, two pixels, or four pixels.

FIGS. 13 and FIG. 14 each illustrates an embodiment in which a first insulating pattern 113P and a second insulating pattern 114P correspond to different numbers of pixels. That is, the number of the first insulating patterns 113P of the third insulating layer 113 is different from the number of the second insulating patterns 114P of the fourth insulating layer 114. FIG. 13 illustrates an embodiment in which a first insulating pattern 113P corresponds to and is arranged/included in one pixel, two pixels, or four pixels and in which a second insulating pattern 114P corresponds to and is arranged/included in eight pixels. FIG. 14 illustrates an embodiment in which a first insulating pattern 113P corresponds to and is arranged/included in eight pixels and in which a second insulating pattern 114P corresponds to and is arranged/included in one pixel, two pixels, or four pixels. In the embodiment illustrated in FIG. 14, the top surface of a first insulating pattern 113P may be partially exposed between second insulating patterns 114P.

The first insulating patterns 113P and the second insulating patterns 114P illustrated in FIGS. 12 through 14 are examples, and the number(s) of pixels sharing a first insulating pattern 113P and the number(s) of pixels sharing a second insulating pattern 114P may be determined according to a manufacturing process and a type of the display apparatus. For example, in a display panel 200, a first insulating pattern 113P may be formed in one pixel, and an integral second insulating pattern 114P may be formed in and shared by two pixels. In an embodiment, in a display panel 200, an integral first insulating pattern 113P may be formed in and shared by four pixels, and an integral second insulating pattern 114P may be formed in and shared by two pixels.

If organic insulating layers including an organic material on the thin film transistor are formed on an entire surface of the substrate, in the manufacturing process, a curing time for the organic insulating layer and the number of outgas sources may increase. As a result, undesirable stress due to stacking layers following the organic insulating layers may increase, and/or much heating treatment may be required.

According to embodiments, organic insulating layer on thin film transistors (e.g., organic insulating layer having via holes and organic insulating layers functioning as pixel defining layers) are provided in the form of islands. Advantageously, a manufacturing process time may be minimized due to reduction in the curing time of the organic insulating layers, an amount of outgas may be minimized, and deformation such as warpage of the display apparatus may be prevented due to stress de-concentration.

According to embodiments, a display apparatus may be manufactured with a less manufacturing process time and may have minimum unwanted deformation.

The described embodiments are illustrative and not for purposes of limitation. Descriptions of features or aspects in an embodiment may be applicable to other embodiments.

While embodiments have been described with reference to the figures, various changes in form and details may be made without departing from the scope defined by the followed claims.

What is claimed is:
1. A display apparatus comprising:
a substrate;
a thin film transistor on the substrate and comprising a semiconductor layer and a gate electrode;
a first insulating layer on the substrate and covering the semiconductor layer and the gate electrode of the thin film transistor;
a second insulating layer on the first insulating layer and at least partially covering a top surface of an electrode connected to the semiconductor layer of the thin film transistor;
a third insulating layer on the second insulating layer, an opening defined in the third insulating layer extends to a top surface of the second insulating layer;
a pixel electrode positioned on the third insulating layer and electrically connected to the thin film transistor by contacting the electrode; and
a fourth insulating layer on the third insulating layer covering an edge of the pixel electrode and a side surface of the third insulating layer,
wherein the opening of the third insulating layer surrounds the entire edge of the pixel electrode in a plan view,
wherein the electrode connected to the semiconductor layer contacts a top surface of the first insulating layer,
wherein the fourth insulating layer covers the entire side surface of the third insulating layer and the top surface of the second insulating layer, in the opening of the third insulating layer, and
wherein the second insulating layer does not have a hole in the opening of the third insulating layer.

2. The display apparatus of claim 1, wherein the pixel electrode contacts one of a source electrode and a drain electrode of the thin film transistor through a hole defined in the third insulating layer and a hole defined in the second insulating layer, and
- wherein the electrode connected to the semiconductor layer is one of the source electrode and the drain electrode of the thin film transistor.

3. The display apparatus of claim 2, wherein an opening defined in the fourth insulating layer overlapping the pixel electrode does not overlap the hole defined in the third insulating layer and the hole defined in the second insulating layer.

4. The display apparatus of claim 2, wherein the opening of the third insulating layer is positioned around the pixel electrode.

5. The display apparatus of claim 1, wherein the second insulating layer comprises an inorganic material.

6. The display apparatus of claim 1, wherein the third insulating layer comprises an organic material.

7. The display apparatus of claim 1, further comprising:
- an emission layer on the pixel electrode; and
- an opposite electrode on the emission layer.

8. The display apparatus of claim 7, further comprising an encapsulation member on the opposite electrode and comprising at least one inorganic material layer and at least one organic material layer.

* * * * *